United States Patent
Kao

(10) Patent No.: US 11,828,799 B2
(45) Date of Patent: Nov. 28, 2023

(54) ELECTRICAL PROPERTY TESTING DEVICE OF EVALUATION BOARD

(71) Applicant: Universal Scientific Industrial (Shanghai) Co., Ltd., Shanghai (CN)

(72) Inventor: Ho-Chu Kao, Shanghai (CN)

(73) Assignee: Universal Scientific Industrial (Shanghai) Co., Ltd., Shanghai (CN)

(*) Notice: Subject to any disclaimer, the term of this patent is extended or adjusted under 35 U.S.C. 154(b) by 0 days.

(21) Appl. No.: 17/657,124

(22) Filed: Mar. 29, 2022

(65) Prior Publication Data

US 2023/0236243 A1    Jul. 27, 2023

(30) Foreign Application Priority Data

Jan. 24, 2022 (CN) .......................... 202210079439.2

(51) Int. Cl.
     *G01R 31/28*        (2006.01)

(52) U.S. Cl.
     CPC ................................ *G01R 31/2889* (2013.01)

(58) Field of Classification Search
     CPC .... G01R 31/00; G01R 31/317; G01R 31/318; G01R 31/319; G01R 31/2889; G01R 31/31905; G01R 1/07364
     See application file for complete search history.

(56) References Cited

U.S. PATENT DOCUMENTS 3,946,310 A * 3/1976 Saper ............... G01R 31/31905
324/72.5

6,087,839 A * 7/2000 Choi ................... G01R 31/2806
324/763.01

(Continued)

FOREIGN PATENT DOCUMENTS

| CN | 101738534 B | * | 7/2013 | ........... G01R 19/165 |
| CN | 105606939 A | * | 5/2016 | ............. G01R 31/00 |

(Continued)

OTHER PUBLICATIONS

Sun et al _CN_101738534_B_2013 English Translation with figures (Year: 2013).*

(Continued)

*Primary Examiner* — Jermele M Hollington
*Assistant Examiner* — Suresh K Rajaputra
(74) *Attorney, Agent, or Firm* — CKC & Partners Co., LLC

(57) ABSTRACT

An electrical property testing device of an evaluation board includes a main circuit board, a voltage detecting unit, a storing unit, a processing unit and an adapter board. The voltage detecting unit is configured to detect a plurality of voltage values of the signal pads. The storing unit stores a plurality of standard voltage values corresponding to the signal pads. The processing unit is electrically connected to the voltage detecting unit and the storing unit. The processing unit receives the voltage values and determines whether the voltage values match the standard voltage values to generate a determining result. The adapter board includes a plurality of conductive pads. The conductive pads are correspondingly connected to the signal pads of the evaluation board. The voltage detecting unit detects the voltage values of the signal pads of the evaluation board via the conductive pads.

6 Claims, 6 Drawing Sheets

(56) References Cited

U.S. PATENT DOCUMENTS

| | | | | |
|---|---|---|---|---|
| 2008/0024159 A1* | 1/2008 | Tilbor | ................ | G01R 31/2889 |
| | | | | 324/99 R |
| 2010/0204949 A1* | 8/2010 | Chang | .................... | G01R 35/00 |
| | | | | 702/120 |
| 2019/0391202 A1* | 12/2019 | Chang | ................ | G01R 31/2813 |
| 2021/0373089 A1* | 12/2021 | Ciou | ...................... | G01R 31/68 |
| 2022/0128618 A1* | 4/2022 | Thiel | .................... | H05K 1/0268 |

FOREIGN PATENT DOCUMENTS

| | | |
|---|---|---|
| CN | 205880146 U | 1/2017 |
| CN | 109581132 A | 4/2019 |
| TW | I642943 B | 12/2018 |
| TW | I745775 B | 11/2021 |
| TW | I750173 B | 12/2021 |
| TW | 202201017 A | 1/2022 |
| TW | I751877 B | 1/2022 |

OTHER PUBLICATIONS

Sun et al _CN_101738534 B_2008_ English Translation with Figures (Year: 2008).*

Wang Zhourong_CN105606939A_2016_machine translation (Year: 2016).*

* cited by examiner

ELECTRICAL PROPERTY TESTING DEVICE OF EVALUATION BOARD

RELATED APPLICATIONS

This application claims priority to China Application Serial Number 202210079439.2, filed Jan. 24, 2022, which is herein incorporated by reference.

BACKGROUND

Technical Field

The present disclosure relates to an electrical property testing device. More particularly, the present disclosure relates to an electrical property testing device of an evaluation board.

Description of Related Art

When a system in package (SiP) product is performing a test program, a testing socket and a testing evaluation board are collocated to perform the electrical property testing. FIG. 1 shows a schematic view of the system in package product 20 testing on an evaluation board 10. The evaluation board 10 includes a circuit board 11, a testing socket 12, a signal cable 13 and a power transforming chip 14. The testing socket 12 includes a plurality of signal pads, the signal cable 13 provides a power, a clock signal and a control signal to the system in package product 20 via the signal pads of the testing socket 12. However, the system in package product 20 may be damaged if any of the power voltage, the clock signal and the control signal provided from the evaluation board 10 is error. Therefore, an electrical property testing should be performed to the evaluation board 10 before the system in package product 20 performs the electrical test program.

The conventional evaluation board test fixture is connected to a computer, a Digital MultiMeter (DMM) and a power switch board while performing a testing program. The set up process of the aforementioned testing program is complex, and spends a lot of pre-operation time. Thus, an electrical property testing device of an evaluation board which is portable, without addition circuit, and without controlling by a computer program is commercially desirable.

SUMMARY

According to one aspect of the present disclosure, an electrical property testing device of an evaluation board is configured to test a plurality of signal pads of the evaluation board. The electrical property testing device of the evaluation board includes a main circuit board, a voltage detecting unit, a storing unit, a processing unit and an adapter board. The voltage detecting unit is disposed on the main circuit board, and configured to detect a plurality of voltage values of the signal pads. The storing unit is disposed on the main circuit board, and stores a plurality of standard voltage values. The standard voltage values are corresponding to the signal pads. The processing unit is disposed on the main circuit board, and electrically connected to the voltage detecting unit and the storing unit. The processing unit receives the voltage values of the signal pads and determines whether the voltage values match the standard voltage values to generate a determining result. The adapter board is electrically connected to the main circuit board, and includes a plurality of conductive pads.

The conductive pads are correspondingly connected to the signal pads of the evaluation board. The voltage detecting unit detects the voltage values of the signal pads of the evaluation board via the conductive pads of the adapter board.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
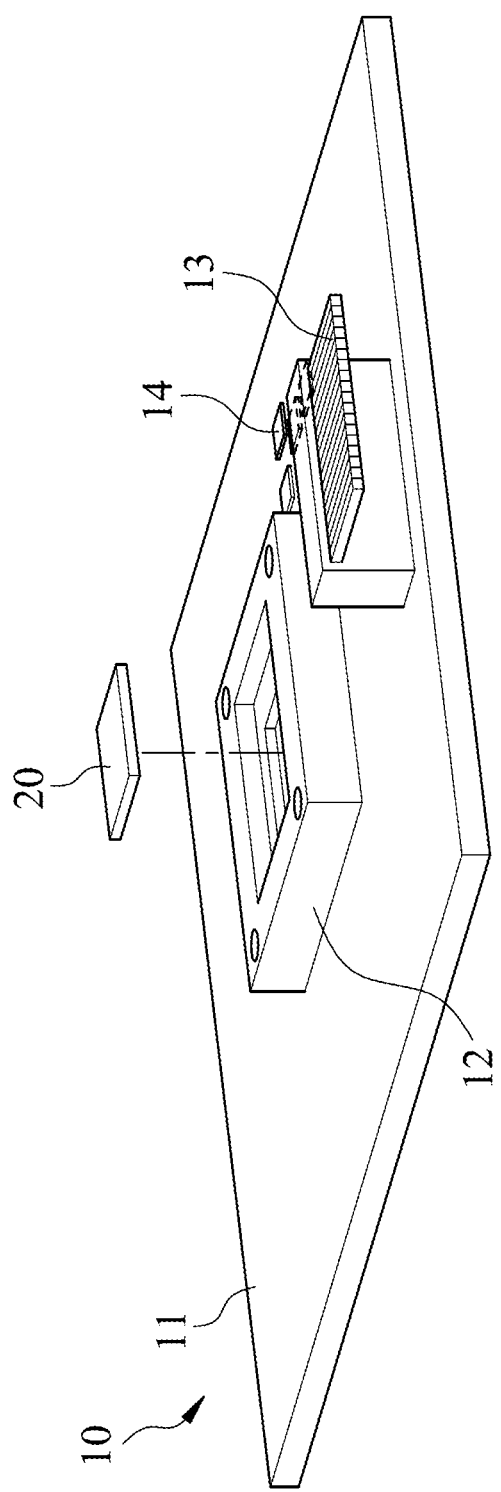
FIG. 1 shows a schematic view of the system in package product testing on an evaluation board.
Figure 2:
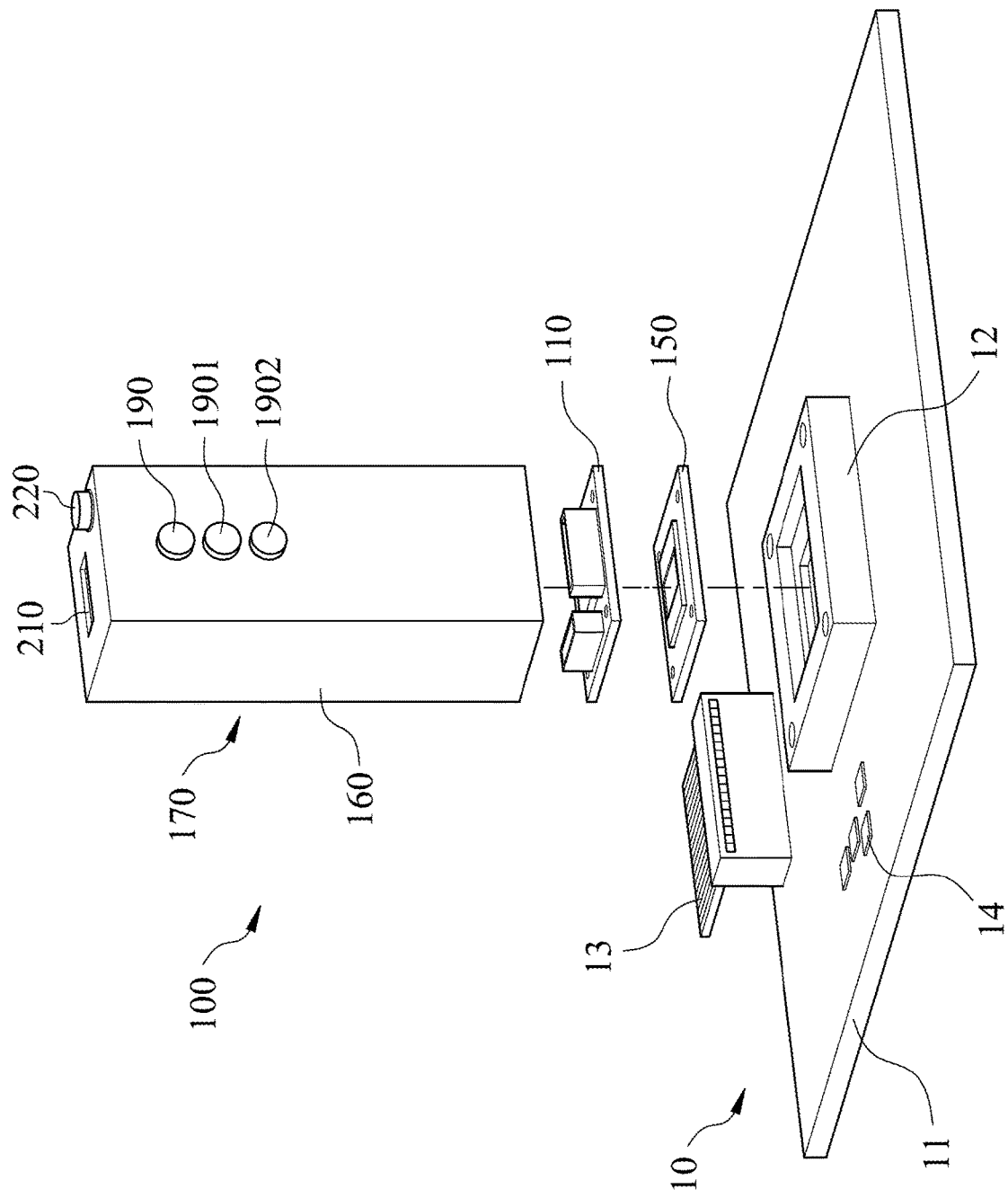
FIG. 2 shows a three-dimensional schematic view of an electrical property testing device of an evaluation board according to a first embodiment of the present disclosure.
Figure 3:
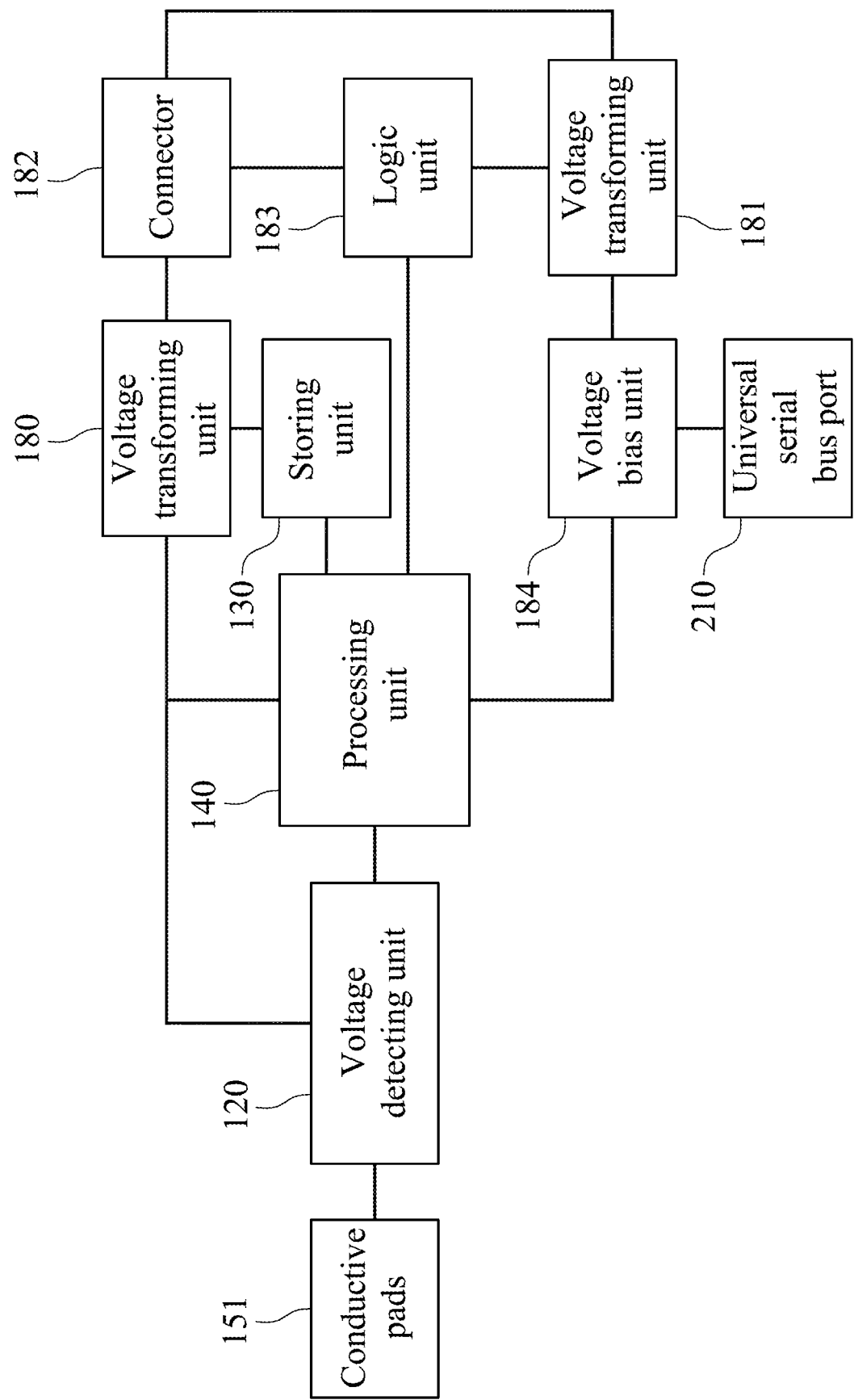
FIG. 3 shows a block diagram of the electrical property testing device of the evaluation board of FIG. 2.

Please refer to FIG. 2 and FIG. 3. FIG. 2 shows a three-dimensional schematic view of an electrical property testing device 100 of the evaluation board 10 according to a first embodiment of the present disclosure. FIG. 3 shows a block diagram of the electrical property testing device 100 of the evaluation board 10 of FIG. 2. The electrical property testing device 100 of the evaluation board 10 includes a main circuit board 110, a voltage detecting unit 120, a storing unit 130, a processing unit 140 and an adapter board 150. The voltage detecting unit 120 is disposed on the main circuit board 110, and configured to detect a plurality of voltage values of the signal pads. The storing unit 130 is disposed on the main circuit board 110, and stores a plurality of standard voltage values. The standard voltage values are corresponding to the signal pads. The processing unit 140 is disposed on the main circuit board 110, and electrically connected to the voltage detecting unit 120 and the storing unit 130. The processing unit 140 receives the voltage values of the signal pads and determines whether the voltage values match the standard voltage values to generate a determining result. The adapter board 150 is electrically connected to the main circuit board 110, and includes a plurality of conductive pads 151 (shown in FIG. 3). The conductive pads 151 are correspondingly connected to the signal pads of the evaluation board 10. The voltage detecting unit 120 detects the voltage values of the signal pads of the evaluation board 10 via the conductive pads 151 of the adapter board 150. Thus, the electrical property testing device 100 of the evaluation board 10 of the present disclosure can put in the evaluation board 10 directly, measure the multi-points voltage of the testing socket 12, and determine whether the voltage values of the signal pads are correct immediately.

In detail, the main circuit board 110 is connected to the adapter board 150. When the main circuit board 110 and the adapter board 150 are disposed in the testing socket 12 of the evaluation board 10, the conductive pads 151 of the adapter board 150 contact the signal pads in the testing socket 12, respectively. The voltage detecting unit 120 detects the voltage values of the power, the clock signal and the control signal provided from the signal cable 13 of the evaluation board 10 via the signal pads. The processing unit 140 reads the standard voltage values of the storing unit 130. The standard voltage values are a plurality of normal voltage values of the signal pads of the evaluation board 10. The processing unit 140 compares the voltage values with the standard voltage values, and assures whether any abnormal value is existed in the voltage values to generate the determining result.

The voltage detecting unit 120 can be a voltage detecting chip, the storing unit 130 can be an Electrically Erasable Programmable Read Only Memory (EEPROM) or other data storing element, the processing unit 140 can be a microprocessor, a Central Processing Unit (CPU) or other electronic processor, but the present disclosure is not limited thereto.

Figure 4:
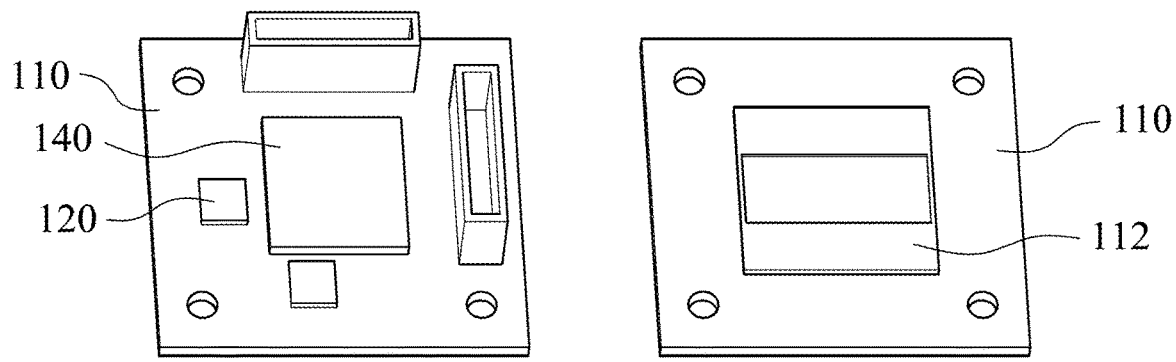
FIG. 4 shows a schematic view of a main circuit board of the electrical property testing device of the evaluation board of FIG. 2.
Figure 5:
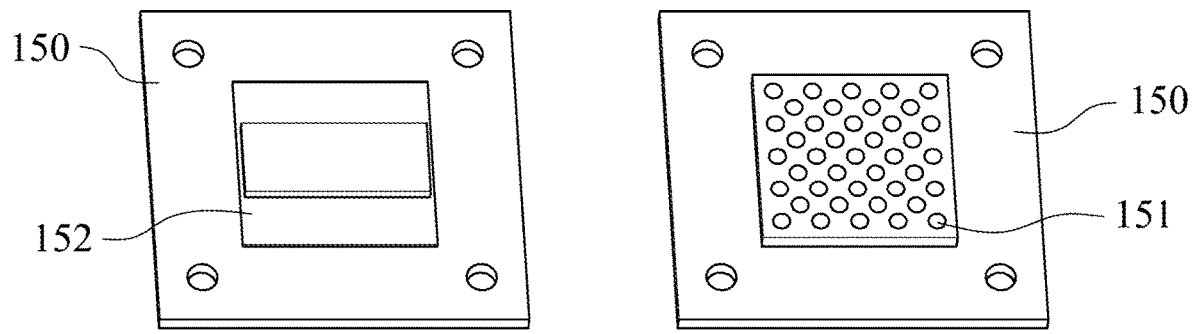
FIG. 5 shows a schematic view of an adapter board of the electrical property testing device of the evaluation board of FIG. 2.

Please refer to FIG. 2 to FIG. 5. FIG. 4 shows a schematic view of the main circuit board 110 of the electrical property testing device 100 of the evaluation board 10 of FIG. 2. FIG. 5 shows a schematic view of the adapter board 150 of the electrical property testing device 100 of the evaluation board 10 of FIG. 2. The electrical property testing device 100 of the evaluation board 10 can further include two board to board connectors 112, 152. The board to board connector 112 is disposed on the main circuit board 110. The another board to board connector 152 is disposed on the adapter board 150, and connected to the board to board connector 112. In other words, the voltage detecting unit 120, the storing unit 130, the processing unit 140 and other electrical elements are disposed on a side of the main circuit board 110, and the board to board connector 112 is disposed on another side of the main circuit board 110. The board to board connector 152 is disposed on a side of the adapter board 150, and the conductive pads 151 are disposed on another side of the adapter board 150. The main circuit board 110 and the adapter board 150 are embedded to each other via the board to board connectors 112, 152, and the voltage values of the signal pads of the evaluation board 10 are transmitted by the adapter board 150 to the main circuit board 110 via the board to board connectors 112, 152 and the conductive pads 151.

Please refer to FIG. 2 and FIG. 3. The electrical property testing device 100 of the evaluation board 10 further includes a housing 160, a battery 170, a voltage transforming unit 180, at least one alert unit 190, a universal serial bus port 210 and a trigger button 220. The housing 160 has an accommodating space. The battery 170 is disposed in the accommodating space, and electrically connected to the processing unit 140. The battery 170 provides a power to the voltage detecting unit 120, the storing unit 130 and the processing unit 140. The voltage transforming unit 180 is disposed on the main circuit board 110, and electrically connected between the battery 170 and the processing unit 140. The at least one alert unit 190 is disposed on the housing 160, and electrically connected to the processing unit 140. The universal serial bus port 210 is disposed on the housing 160, and electrically connected to the processing unit 140. The trigger button 220 is disposed on the housing 160, and electrically connected to the processing unit 140. The processing unit 140 configures the voltage detecting unit 120 to detect the voltage values according to whether the trigger button 220 is triggered or not.

Furthermore, the battery 170 transforms the voltage of the battery 170 to a rated voltage of the processing unit 140. The alert unit 190 can be one of a light emitting device and a buzzer, but the present disclosure is not limited thereto. In response to determining that the determining result is an abnormal state, the processing unit 140 configures the at least one alert unit 190 to show at least one alert state. Except for the alert unit 190, the electrical property testing device 100 of the evaluation board 10 further includes the alert units 1901, 1902. The battery 170 and the alert units 190, 1901, 1902 disposed on the housing 160 are electrically connected to the main circuit board 110 via a connector 182. The processing unit 140 can control the alert units 190, 1901, 1902 via a logic unit 183.

In the embodiment of FIG. 2, when the determining result is the abnormal state, at least one of the voltage values does not match one of the standard voltage values, which is corresponded to the aforementioned at least one of the voltage values, and the alert unit 190 shows the alert state and lights up. When the determining result is the normal state, all of the voltage values match all of the standard voltage values, and the alert unit 1901 lights up with a color different to the alert unit 190. The electrical property testing device 100 of the evaluation board 10 of the present disclosure can turn on and off via the trigger button 220. When the trigger button 220 is triggered, the battery 170 provides the power to the processing unit 140, and the alert unit 1902 is configured to show the switch status of the electrical property testing device 100 of the evaluation board 10. Thus, the electrical property testing device 100 of the evaluation board 10 of the present disclosure can be moved to the test fixture portably, put into the evaluation board 10 directly, and measure the multi-points voltage of the evaluation board 10 by one-click, and then show the determining result immediately.

The electrical property testing device 100 of the evaluation board 10 can further include a universal serial bus port 210. The universal serial bus port 210 is disposed on the housing 160, and electrically connected to the processing unit 140. The universal serial bus port 210 can connect to the processing unit 140 via a voltage bias unit 184. Moreover, the voltage bias unit 184 can connect to the connector 182 via another voltage transforming unit 181. A user can connect the electrical property testing device 100 of the evaluation board 10 of the present disclosure with a computer or a displayer via the universal serial bus port 210, and the processing unit 140 can transmit the determining result to the displayer via the universal serial bus port 210. The user can view each of the voltage values of each of the signal pads of the evaluation board 10 via the displayer, and find out one of the signal pad which has an abnormal voltage value. The universal serial bus port 210 is also for the user to update the standard voltage values in the storing unit 130. Thus, the electrical property testing device 100 of the evaluation board 10 of the present disclosure can perform a testing program to a plurality of evaluation boards for different kinds of the system in package products 20 by revising the standard voltage values stored in the storing unit 130 and changing adapter boards with the signal pads which are corresponding to different evaluation boards.

Figure 6:
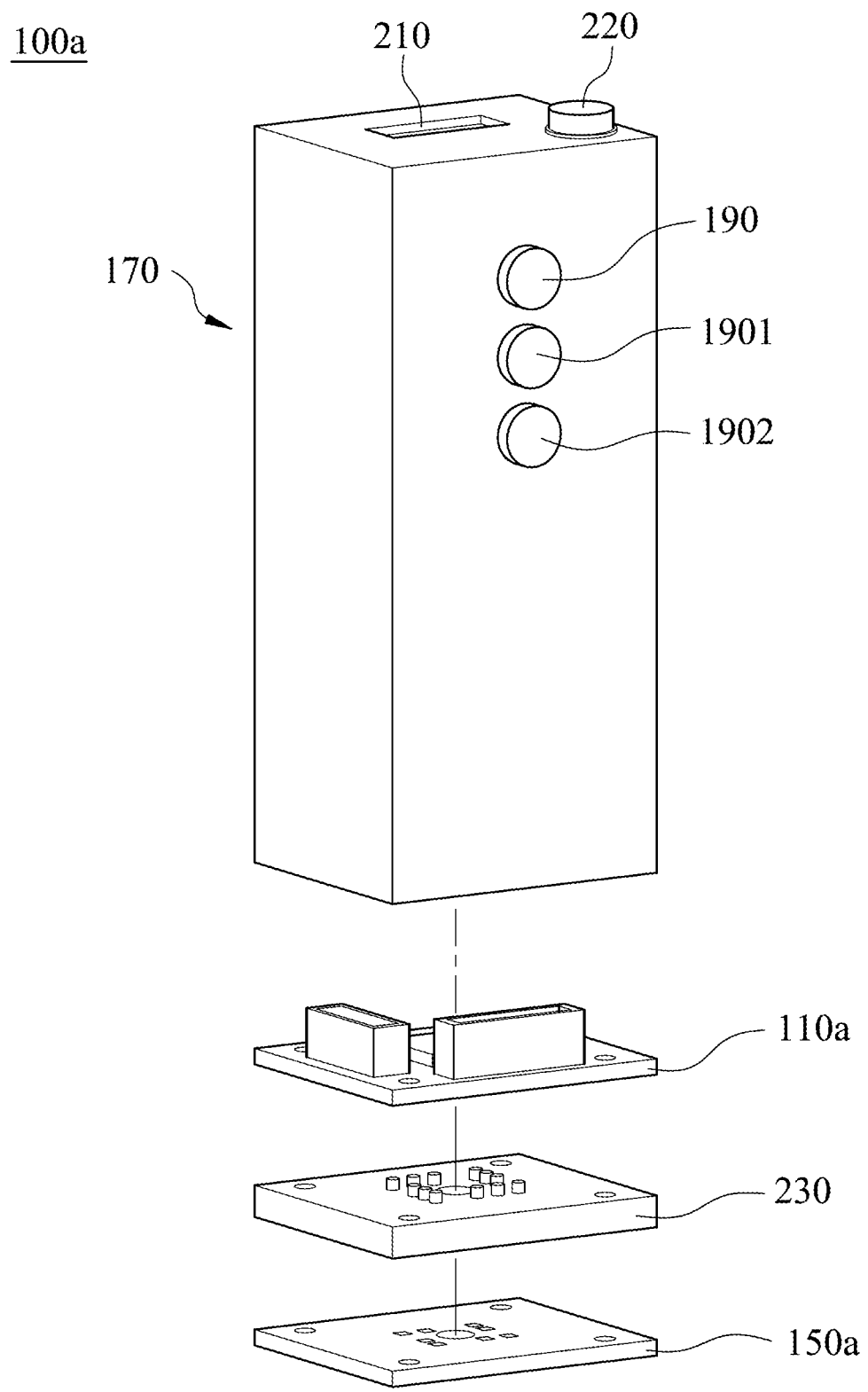
FIG. 6 shows a three-dimensional schematic view of an electrical property testing device of the evaluation board according to a second embodiment of the present disclosure.

Please refer to FIG. 2 and FIG. 6. FIG. 6 shows a three-dimensional schematic view of an electrical property testing device 100a of the evaluation board 10 according to a second embodiment of the present disclosure. The electrical property testing device 100a of the evaluation board 10 is configured to test a plurality of signal pads of the evaluation board 10. The electrical property testing device 100a of the evaluation board 10 includes a main circuit board 110a, a voltage detecting unit 120, a storing unit 130, a processing unit 140 and an adapter board 150a. In FIG. 6, the voltage detecting unit 120, the storing unit 130 and the processing unit 140 of the electrical property testing device 100a of the evaluation board 10 are the same as the voltage detecting unit 120, the storing unit 130 and the processing unit 140 of the electrical property testing device 100 of the evaluation board 10 in FIG. 2, respectively, and will not be described again. Furthermore, the electrical property testing device 100a of the evaluation board 10 can further include a pogo pin board 230. The main circuit board 110a and the adapter board 150a are electrically connected to each other via the pogo pin board 230. The adapter board 150a is electrically connected to the main circuit board 110a, and includes a plurality of conductive pads 151 (shown in FIG. 9). The conductive pads 151 are correspondingly connected to the signal pads of the evaluation board 10. The voltage detecting unit 120 detects the voltage values of the signal pads of the evaluation board 10 via the conductive pads 151 of the adapter board 150a. Thus, the electrical property testing device 100a of the evaluation board 10 of the present disclosure can put in the evaluation board 10 directly, measure the multi-points voltage of the testing socket 12, and determine whether the voltage values of the signal pads are correct immediately.

Figure 7:
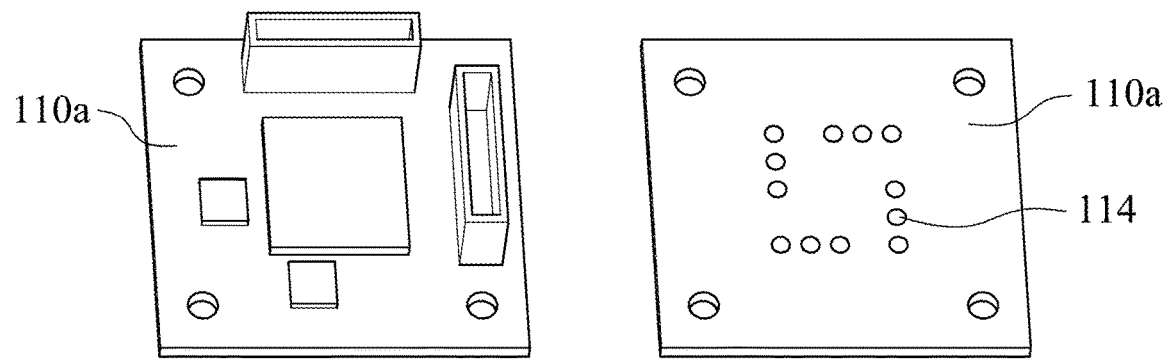
FIG. 7 shows a schematic view of a main circuit board of the electrical property testing device of the evaluation board of FIG. 6.
Figure 8:
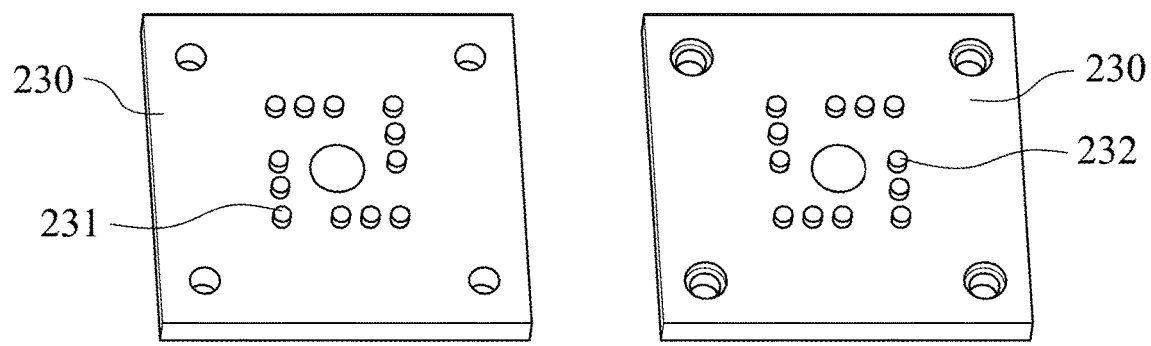
FIG. 8 shows a schematic view of a pogo pin board of the electrical property testing device of the evaluation board of FIG. 6.
Figure 9:
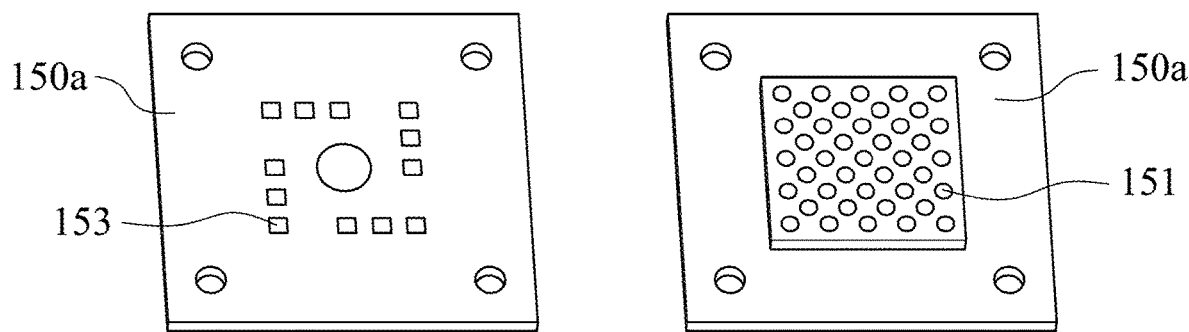
FIG. 9 shows a schematic view of an adapter board of the electrical property testing device of the evaluation board of FIG. 6.

Please refer to FIG. 3, FIG. 6 to FIG. 9. FIG. 7 shows a schematic view of the main circuit board 110a of the electrical property testing device 100a of the evaluation board 10 of FIG. 6. FIG. 8 shows a schematic view of the pogo pin board 230 of the electrical property testing device 100a of the evaluation board 10 of FIG. 6. FIG. 9 shows a schematic view of the adapter board 150a of the electrical property testing device 100a of the evaluation board 10 of FIG. 6. The voltage detecting unit 120, the storing unit 130, the processing unit 140 and other electrical elements are disposed on a side of the main circuit board 110a, and a plurality of pogo pads 114 are disposed on another side of the main circuit board 110a. The conductive pads 151 are disposed on a side of the adapter board 150a, and a plurality of pogo pads 153 are disposed on another side of the adapter board 150a. A plurality of pogo pads 231 correspondingly connected to the pogo pads 114 are disposed on a side of the pogo pin board 230, and a plurality of pogo pads 232 correspondingly connected to the pogo pads 153 are disposed on another side of the pogo pin board 230. The voltage values of the evaluation board 10 detected by the conductive pads 151 are transmitted from the adapter board 150a to the main circuit board 110a via the pogo pin board 230.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrical property testing device of an evaluation board, which is configured to test a plurality of signal pads of the evaluation board, and the electrical property testing device of the evaluation board comprising:
   a main circuit board;
   a voltage detecting unit disposed on the main circuit board, and configured to detect a plurality of voltage values of the signal pads;
   a storing unit disposed on the main circuit board, and storing a plurality of standard voltage values, wherein the standard voltage values are corresponding to the signal pads;
   a processing unit disposed on the main circuit board, and electrically connected to the voltage detecting unit and the storing unit, wherein the processing unit receives the voltage values of the signal pads and determines whether the voltage values match the standard voltage values to generate a determining result; an adapter board electrically connected to the main circuit board, and comprising a plurality of conductive pads, wherein the conductive pads are correspondingly connected to the signal pads of the evaluation board;
   a housing having an accommodating space;
   a battery disposed in the accommodating space, and electrically connected to the processing unit, wherein the battery provides a power to the voltage detecting unit, the storing unit and the processing unit;
   a universal serial bus port disposed on the housing, and electrically connected to the processing unit, wherein the processing unit transmits the determining result to a displayer via the universal serial bus port, and the universal serial bus port is for a user to update the standard voltage values in the storing unit; and
   a trigger button disposed on the housing, and electrically connected to the processing unit, wherein the processing unit configures the voltage detecting unit to detect the voltage values according to whether the trigger button is triggered or not;
   wherein the voltage detecting unit detects the voltage values of the signal pads of the evaluation board via the conductive pads of the adapter board.

2. The electrical property testing device of the evaluation board of claim 1, further comprising:

a voltage transforming unit disposed on the main circuit board, and electrically connected between the battery and the processing unit.

3. The electrical property testing device of the evaluation board of claim 1, further comprising:

at least one alert unit disposed on the housing, and electrically connected to the processing unit;

wherein in response to determining that the determining result is an abnormal state, the processing unit configures the at least one alert unit to show at least one alert state.

4. The electrical property testing device of the evaluation board of claim 3, wherein the at least one alert unit is one of a light emitting device and a buzzer.

5. The electrical property testing device of the evaluation board of claim 1, further comprising:

a board to board connector disposed on the main circuit board; and another board to board connector disposed on the adapter board, and connected to the board to board connector.

6. The electrical property testing device of the evaluation board of claim 1, further comprising:

a pogo pin board, wherein the main circuit board and the adapter board are electrically connected to each other via the pogo pin board.

* * * * *